(12) United States Patent
Throum

(10) Patent No.: US 6,881,077 B2
(45) Date of Patent: Apr. 19, 2005

(54) AUTOMOTIVE CONTROL MODULE HOUSING

(75) Inventor: Michael Throum, Lake Orion, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 10/610,610

(22) Filed: Jul. 1, 2003

(65) Prior Publication Data

US 2004/0014337 A1 Jan. 22, 2004

Related U.S. Application Data

(60) Provisional application No. 60/397,696, filed on Jul. 22, 2002.

(51) Int. Cl.$^7$ .............................................. H01R 12/00
(52) U.S. Cl. ..................... 439/76.1; 439/76.2; 439/487; 174/16.3
(58) Field of Search ............................... 439/76.1, 76.2, 439/521, 487; 174/16.3

(56) References Cited

U.S. PATENT DOCUMENTS

| 4,993,956 | A | * | 2/1991 | Pickles et al. ............. 439/76.1 |
| 5,124,888 | A | * | 6/1992 | Suzuki et al. .............. 439/76.1 |
| 5,402,313 | A | * | 3/1995 | Casperson et al. ......... 174/16.3 |
| 5,548,481 | A | | 8/1996 | Salisbury |
| 5,777,844 | A | * | 7/1998 | Kiefer ....................... 174/16.3 |
| 5,814,765 | A | | 9/1998 | Bauer |
| 5,846,092 | A | * | 12/1998 | Feldman et al. ........... 439/76.1 |
| 5,936,838 | A | * | 8/1999 | Lii et al. .................... 174/16.3 |
| 5,995,380 | A | * | 11/1999 | Maue et al. ................ 439/76.2 |
| 6,025,991 | A | * | 2/2000 | Saito ......................... 174/16.3 |
| 6,099,325 | A | * | 8/2000 | Parkhill ..................... 439/76.1 |
| 6,111,760 | A | | 8/2000 | Nixon |
| 6,162,096 | A | * | 12/2000 | Klaus ........................ 439/76.1 |
| 6,540,543 | B1 | * | 4/2003 | Watanabe .................. 439/76.2 |

FOREIGN PATENT DOCUMENTS

| DE | 3603915 | 8/1987 |
| EP | 0 714228 A2 | 5/1996 |
| FR | 2 655 809 A1 | 6/1991 |

OTHER PUBLICATIONS

Search Report, dated Oct. 29, 2003.

* cited by examiner

Primary Examiner—Tho D. Ta

(57) ABSTRACT

An automotive control module includes a plastic housing with a snap-fit metal cover. A printed circuit board is positioned within a cavity formed in the housing, and is attached to the housing with a plurality of fasteners. Resilient tabs are formed on side walls of the housing and grip a cover plate surface to define a snap-fit attachment. Once the cover is attached to the plastic housing, the printed circuit board is enclosed within the cavity between the cover and the housing. The cover includes a plurality of heat transfer fins and/or stamped indentations that form surfaces that are positioned in close proximity to the printed circuit board. The cover utilizes these fins and surfaces to form a heat sink for cooling electronics mounted to the printed circuit board.

13 Claims, 3 Drawing Sheets

AUTOMOTIVE CONTROL MODULE HOUSING

CROSS-REFERENCE TO RELATED APPLICATIONS

The application claims priority to U.S. Provisional Application No. 60/397,696, which was filed on Jul. 22, 2002.

BACKGROUND OF THE INVENTION

This invention relates to an automotive control module that includes a unique base plate that is snap-fit to a module housing with an integrated connector to enclose a printed circuit board within the housing, and which simultaneously provides a heat sink to cool the printed circuit board and associated electronics.

Automotive control modules include electronics and software that are used to control various vehicle systems. For example, control modules are used to control engines, automatic transmission shifts, transfer case clutching and declutching, etc. Control modules traditionally have a plastic or steel housing, a printed circuit board (PCB) and associated electronics, and a connector that connects to a vehicle wire harness. The housing is mounted to a vehicle structure with fasteners.

During vehicle operation, the electronics on the PCB generate a significant amount of heat, which must be drawn away from the PCB to prevent over-heating. Traditionally, a heat sink plate has been fastened first to the PCB and then to the housing with a separate housing cover being used enclose the heat sink plate and PCB within the housing. The housing cover is fastened to the housing with rivets or screws to provide a secure attachment.

This control module configuration has several disadvantages. A significant number of components are required, which increases material and manufacturing costs. Further, this configuration is difficult and time consuming to assemble.

Thus, it is desirable to have a simplified automotive control module that can provide sufficient cooling in an enclosed environment for the PCB, as well as overcoming the other above mentioned deficiencies with the prior art.

SUMMARY OF THE INVENTION

An automotive control module includes a housing with a snap-fit cover plate that provides a heat sink and encloses control electronics within the housing. The control electronics are mounted to a printed circuit board (PCB) that is positioned within a cavity formed in the housing. The PCB can have electronics mounted on either or both of the upper or lower surfaces that form the board.

The cover plate is preferably formed from aluminum and includes a generally flat body portion with indentations that form surfaces that are positioned in close proximity to the PCB, but do not actually contact the PCB. The cover plate utilizes these surfaces to form a heat sink for cooling the control electronics mounted to the PCB. Optionally, or in addition to the indentations, the cover plate includes a plurality of fins to improve heat transfer from the PCB to the cover plate.

The housing is preferably formed from a plastic material and includes a bottom portion, a first pair of opposing outer side walls extending upwardly from the bottom portion, and a second pair of opposing outer side walls extending between both of the first pair of opposing outer side walls. The first and second pairs of outer side walls cooperate with the bottom portion to define the cavity. The housing also includes a pair of opposing inner side walls positioned within the cavity in an orientation parallel to and spaced apart from the first pair of opposing outer side walls.

In one disclosed embodiment, resilient tabs are formed on the first pair of opposing outer side walls. The resilient tabs move outwardly from an initial position in response to a snap-fit insertion force applied against the cover plate. The cover plate is pushed against the housing until a bottom surface of the cover plate abuts against a top edge surface of the inner side walls. The resilient tabs then return to their initial position and grip a top surface of the cover plate. Thus, the cover plate is sandwiched between the resilient tabs and the top edge of the inner side walls and serves as both a heat sink and a protective cover.

In one disclosed embodiment, resilient tabs are formed on the opposing inner side walls of the housing and are snap-fit into openings formed within transversely extending edge portions of the cover. In this configuration, the cover includes a base portion with the opposing edge portions being bent approximately ninety degrees such that the edge portions can be inserted between the inner and outer opposing side walls. The tabs gripping bore surfaces that form the openings in the cover to secure the cover to the housing. In this embodiment the cover also serves as both a heat sink and a protective cover.

The subject automotive control module utilizes fewer components, has decreased manufacturing costs, and is easier to assemble than traditional control modules. These and other features of the present invention can be best understood from the following specifications and drawings, the following of which is a brief description.

DETAILED DESCRIPTION OF A PREFERRED EMBODIMENT

An automotive control module 10 generates a control signal 12 that is communicated to a vehicle system 14. The vehicle system 14 can be any of various vehicle systems such as engine management, transmission management, wheel drive management, braking management, or other similar vehicle systems. Preferably, the control module 10 uses the control signal 12 to manage a vehicle transfer case system 14 to achieve all-wheel drive under predetermined conditions.

Figure 1:
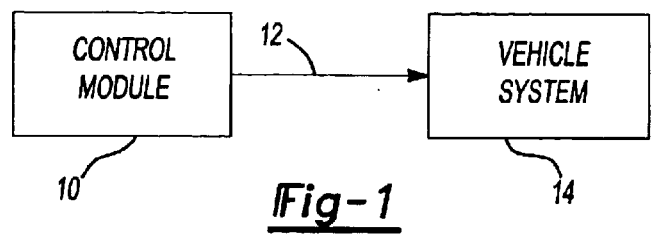
FIG. 1 a schematic view of an automotive control module in communication with a vehicle system.
Figure 2:
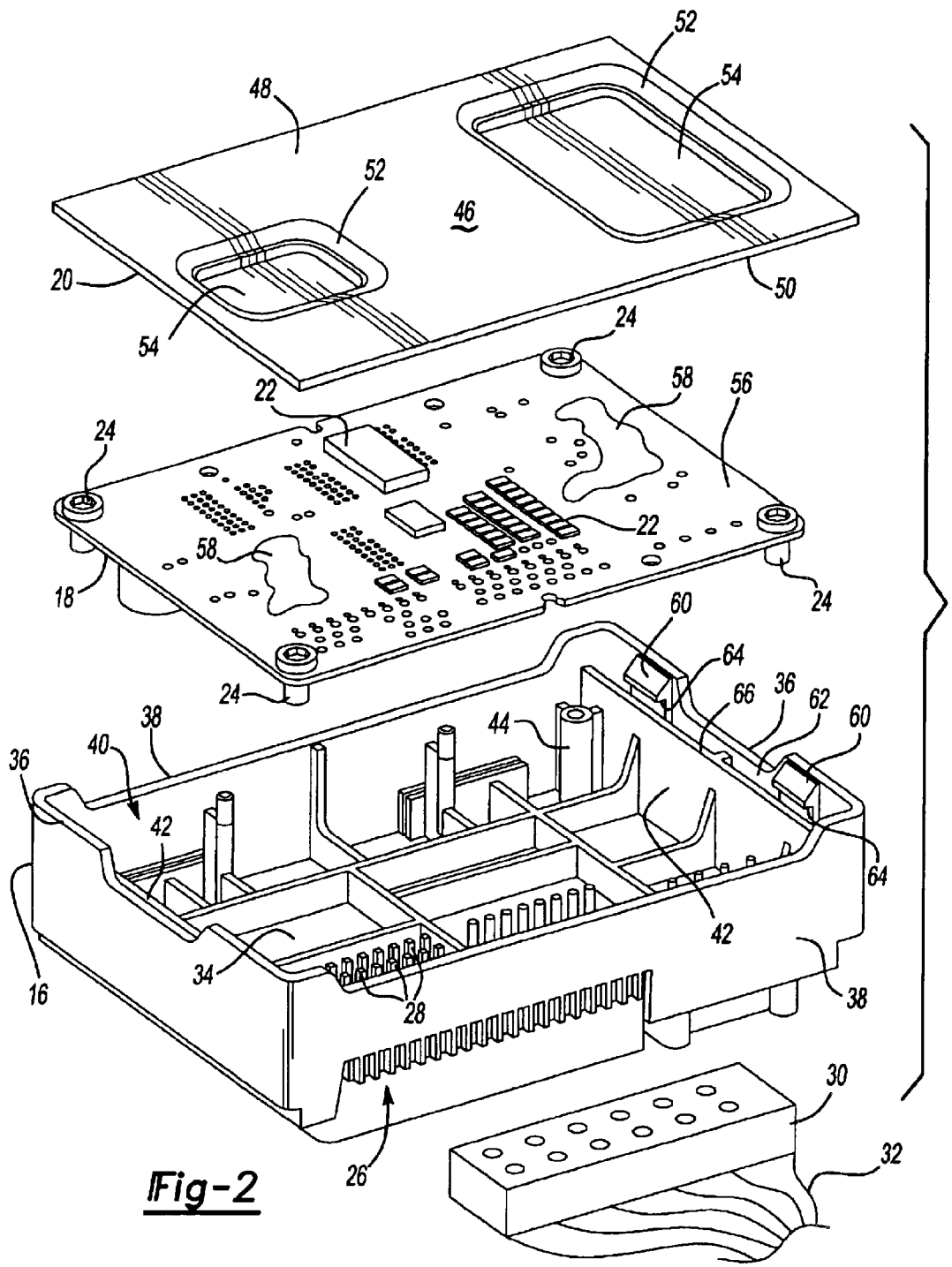
FIG. 2 is an exploded view of an automotive control module incorporating the subject invention.

As shown in FIG. 2, the control module 10 includes a housing 16, a printed circuit board (PCB) 18, and a cover plate 20. The PCB 18 supports a variety of control electronics. The PCB 18 is preferably mounted to the housing 16 with a plurality of fasteners 24.

A connector portion 26 is formed within the housing 16. The connector portion 26 cooperates with a plurality of pins 28 that are soldered or press-fit into holes 22 formed in the PCB 18. The connector portion 26 mates with a corresponding connector portion 30 on a vehicle wire harness 32.

The housing 16 is preferably made from a plastic material and includes a base or bottom portion 34, a first pair of opposing outer side walls 36 that extend upwardly from the bottom portion 34, and a second pair of opposing outer side walls 38 that extend upwardly from the bottom portion 34 and interconnect the first pair of opposing side walls 36 to define a cavity 40. In other words, the bottom portion 34 and first 36 and second 38 pairs of opposing side walls cooperate together to define a generally rectangular housing with an open top.

The housing 16 also includes a pair of inner side walls 42 with one inner side wall 42 being parallel to and spaced apart from a corresponding one of the first pair of opposing outer side walls 36. The PCB 18 is positioned within the cavity 40 between the inner side walls 42. Posts 44 (only one is shown in FIG. 2) are formed within the housing 16 to receive the fasteners 24 that attach the PCB 18 to the housing 16.

The cover plate 20 is preferably made from aluminum or other similar metallic material. The cover plate 20 includes a generally flat body portion 46 with an upper surface 48 and a lower surface 50. In the preferred embodiment, the body portion 46 is formed from a stamped aluminum piece and includes at least one indentation 52. The indentations 52 form a recess on the upper surface 48 of the cover plate 20 and a corresponding extrusion on the lower surface 50. The indentation 52 defines an indentation surface 54 that is non-coplanar with both the upper 48 and lower 50 surfaces of the cover plate 20.

When the cover plate 20 is assembled to the housing 16, the indentation 52 is positioned in close proximity to an upper surface 56 of the PCB 18, but does not actually contact the PCB 18. The cover plate 20 utilizes the indentations 52 to form a heat sink for cooling the control electronics 22 mounted to the PCB 18. A thermal conductive paste 58 is applied the upper surface 56 of the PCB 18 in areas that do not interfere with the electronics 22. The paste 58 facilitates heat transfer from the PCB 18 to the cover plate 20 to cool the electronics 22. When the paste 58 cures, an approximate distance of at least 0.3 millimeters is maintained between the bottom surface of the indentations 52 and the PCB 18. This configuration provides optimal heat transfer without risking electrical shorts that could result if there were direct contact between the cover plate 20 and the PCB 18.

The cover plate 20 is also snap-fit to the housing 16 to enclose the PCB 18 within the housing 16. Thus, the cover plate 20 serves a dual purpose of a heat sink and a protective cover. In the embodiment shown in FIGS. 2–4, housing 16 includes resilient members that grip the cover plate 20 in a snap-fit attachment. These resilient members includes at least one resilient tab 60 on each of the first pair of opposing outer side walls 36. Preferably, a pair of tabs 60 are formed on each of the side walls 36.

Figure 3:
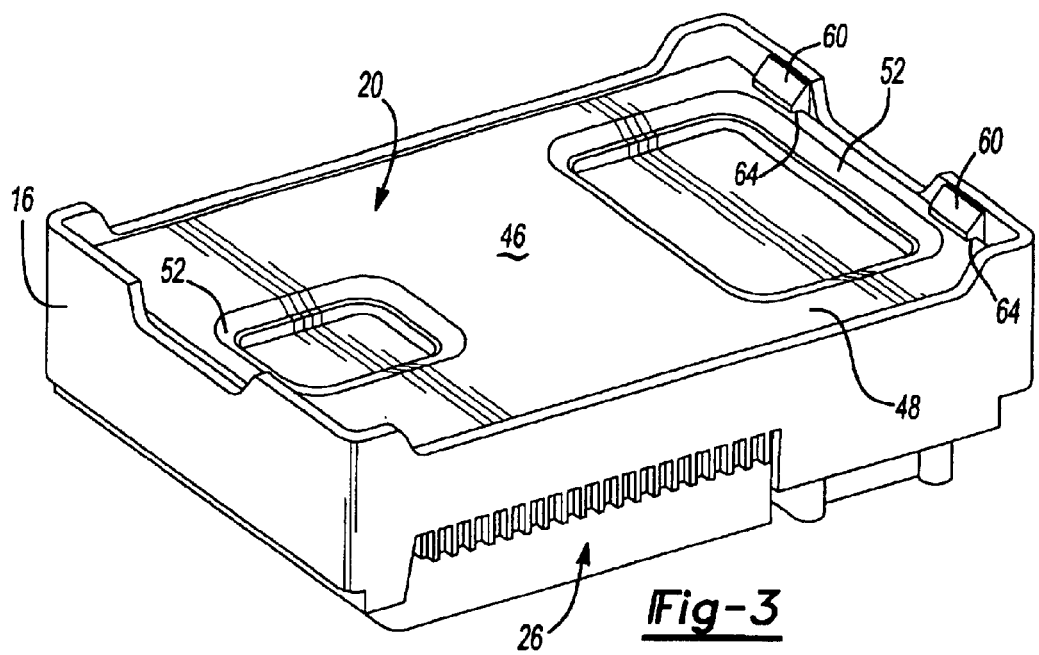
FIG. 3 is a perspective view of the automotive control module of FIG. 2 as assembled.
Figure 4:
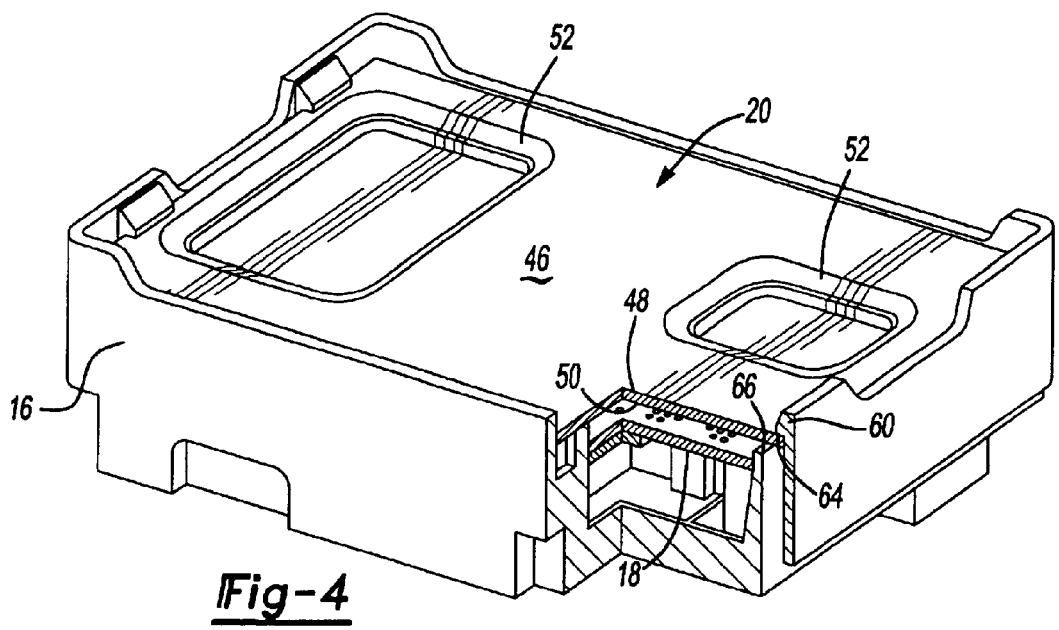
FIG. 4 is a view similar to FIG. 3 but with one corner cut away in cross-section.

The tabs 60 are integrally formed on an inner surface 62 of the side walls 36 and extend to a flexible tip 64. The tabs 60 and a portion of the side walls 36 flex outwardly away from an initial position in response to a snap-in insertion force being applied to the cover plate 20. The cover plate 20 is pushed against the housing 16 until the bottom surface 50 of the cover plate 20 abuts against a top edge surface 66 of the inner side walls 42. Once the cover plate 20 is in abutting contact with the inner side walls 42, the tabs 60 and side walls 36 return to their initial position with the flexible tips 64 now being in gripping engagement with the upper surface 48 of the cover plate 20, as shown in FIG. 3. Thus, the cover plate 20 is sandwiched between the tabs 60 and the top edge surface 66 of the inner side walls 42, as shown in FIG. 4.

The cover plate 20 can be easily removed from the housing 16 by exerting an bending force against the outer side walls 36 to reduce the gripping force between the tabs 60 and cover plate 20. The cover plate 20 can then be popped out to provide access to the PCB 18 and associated electronics 22. Thus, the control module 10 can be easily serviced or repaired and the cover plate 20 can be easily re-installed.

Figure 5:
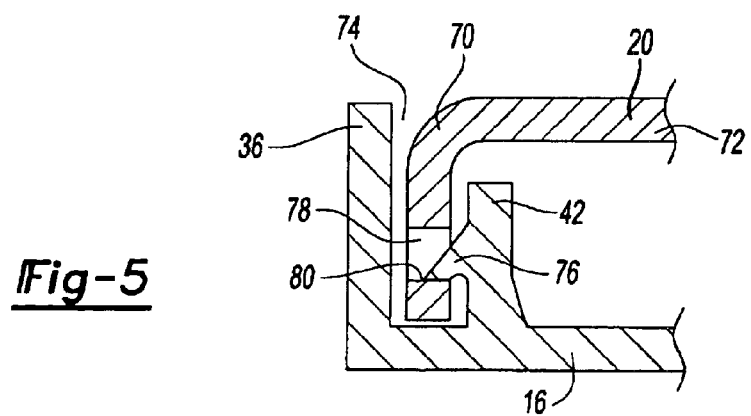
FIG. 5 is a cross-sectional view, partially broken away, of an alternate embodiment.

An alternate snap-fit attachment is shown in FIG. 5. In this embodiment, the cover plate 20 includes a pair of edge portions 70 (only one is shown) that extend transversely to a generally planar main body portion 72. Preferably, the edge portions 70 are bent approximately 90 degrees relative to the body portion 72 and are positioned in a gap 74 formed between the inner 42 and outer 36 opposing side walls. A plurality of resilient tabs 76 are formed on each of the inner opposing side walls 42. The tabs 76 are received in openings 78 that are formed in the edge portions 70. The tabs 76 and associated wall portions bend away from an initial position as the cover plate 20 is pushed against the housing 16 and return to the initial position once distal ends 80 of the tabs 76 are received in gripping engagement with bore surfaces that define the openings 78.

Figure 6:
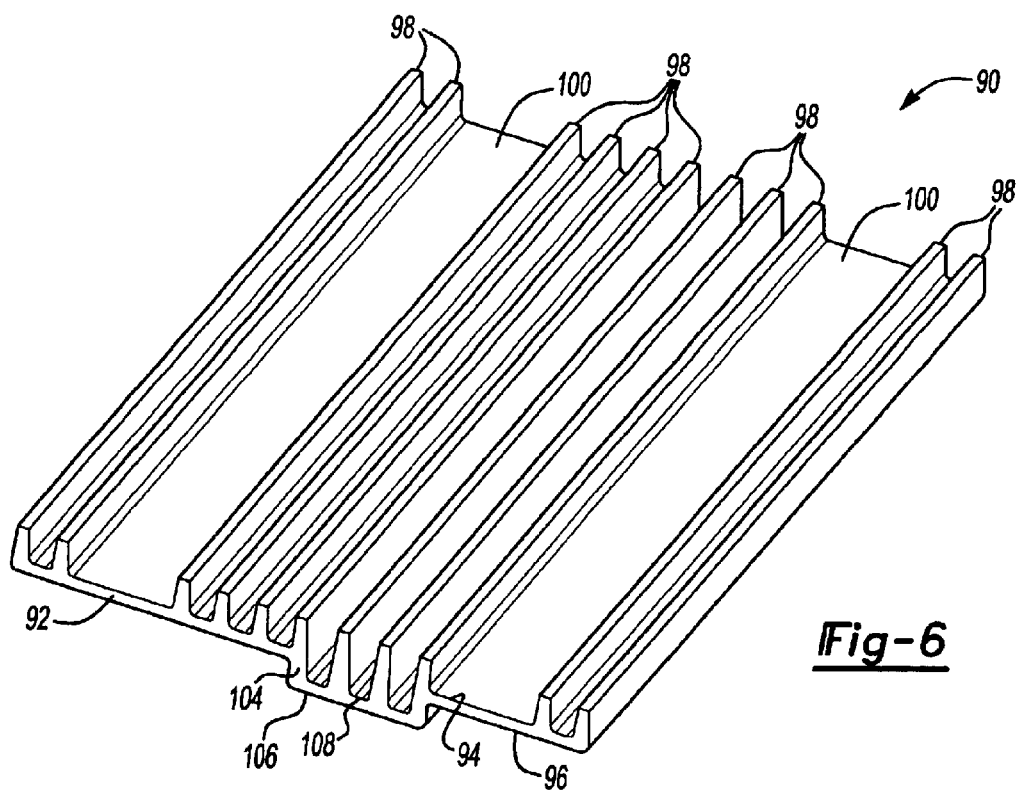
FIG. 6 is a perspective view of an alternate embodiment of a cover plate.
Figure 7:
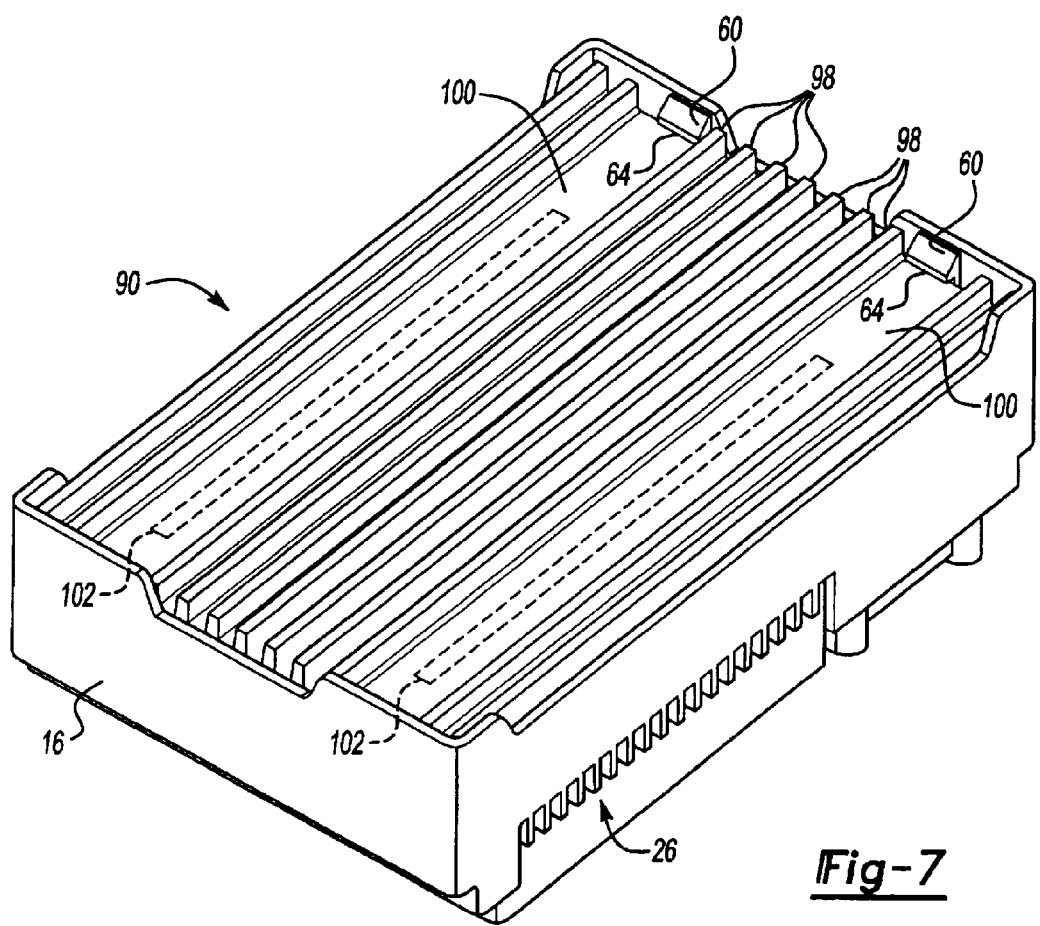
FIG. 7 is a perspective view of the cover plate of FIG. 6 attached to the automotive control module.

An alternate embodiment of a cover 90 is shown in FIGS. 6 and 7. The cover 90 is comprised of a plate body 92 that defines an upper surface 94 and a lower surface 96. A plurality of fins 98 are formed on the upper surface 94 and extend away from the PCB 18. The fins 98 preferably extend in a longitudinal direction along the length of the plate body 92 and are spaced apart from one another in a lateral direction across the width of the plate body 92.

Open spaces 100 on the upper surface 94 are formed such that the fins 98 do not interfere with the tabs 60. The open spaces 100 can extend along the entire length of the plate body 92 as shown in FIG. 6 or shorter fins 102 can be formed at these locations, as shown in FIG. 7.

The cover 90 is preferably made from an extrusion process and includes at least one indentation 104 that defines an indentation lower surface 106 that is positioned in close proximity to the PCB 18. The fins 98 formed on an upper indentation surface 108 are preferably taller than the fins extending from the upper surface 94 of the plate body 92. The combination of the indentation 104 and variable height fins 98 greatly improves heat transfer from the PCB 18 to the cover 90.

The subject provides an automotive control module that requires fewer components, has decreased manufacturing costs, and is easier to assemble than traditional control modules. Also, one of the benefits with the subject invention is that the cover plate 20 serves as both a heat sink and a protective cover for the PCB 18. Further, the assembly process is improved and simplified because the PCB 18 is mounted first to the housing 16 with the cover plate 20 being snap-fit to the housing. Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An automotive electronic control module assembly comprising:

a housing defining an inner cavity;

a printed circuit board positioned within said cavity and mounted to said housing;

a cover plate positioned over said cavity to enclose said printed circuit board within said housing;

a plurality of resilient members formed on said housing; and a retaining surface formed on said cover wherein said resilient members engage said retaining surface to securely attach said cover plate to said housing wherein said cover plate is positioned in an overlapping non-contact relationship with said printed circuit board and is spaced apart from said printed circuit board by a gap to form a heat sink wherein said housing includes a first pair of opposing outer side walls, a second pair of opposing outer side walls extending between both of said first pair of opposing outer side walls to define said cavity, and a pair of opposing inner side walls parallel to and spaced apart from said first pair of opposing outer side walls wherein said inner side walls engage at least a portion of said retaining surface.

2. An assembly as set forth in claim 1 wherein said resilient members are formed on each of said opposing inner side walls and are in gripping engagement with a bore surface formed with said cover.

3. An assembly as sot forth in claim 1 including electronics mounted to said printed circuit board for generating an all-wheel drive control signal under predefined conditions.

4. An assembly as set forth in claim 1 wherein at least one of said resilient members is formed on each of said first pair of opposing outer side walls with said resilient members moving away from an initial position in response to a snap-in insertion force exerted against said cover plate and returning to said initial position after said cover plate is in abutting engagement with each of said inner side walls.

5. An assembly as set forth in claim 4 wherein a bottom surface of said cover plate is in direct abutting engagement with a top edge surface of each of said inner side walls.

6. An assembly as set forth in claim 5 wherein each of said resilient members comprise a resilient tab extending to a distal zip and wherein said cover plate is positioned between said tabs and said top edge surface of said inner side walls with an upper surface of said cover plate directly engaging said distal tip such that a first portion of said retaining surface is formed on said top edge surface of said inner side walls and a second portion of said retaining surface is formed on said upper surface of said cover plate underneath each one of said tabs.

7. An automotive electronic control module assembly comprising:

a plastic housing including a bottom portion, a first pair of opposing outer side walls extending upwardly from said bottom portion, a second pair of opposing outer side walls extending between both of said first pair of opposing outer side walls and cooperating with said bottom portion to define a cavity, and a pair of opposing inner side walls positioned within said cavity in an orientation parallel to and spaced apart from said first pair of opposing outer side walls;

a printed circuit board positioned within said cavity between said inner side walls;

a cover comprised of aluminum and positioned over said cavity to enclose said printed circuit board within said housing, said cover having a body portion and including at least one heat transfer member that is positioned closer to said printed circuit board than said body portion to form a heat sink to facilitate heat transfer from said printed circuit board to said cover, a plurality of resilient members formed on said housing; and a retaining surface formed on said cover wherein said resilient members engage said retaining surface to securely attach said cover to said housing.

8. An assembly as set forth in claim 7 wherein said resilient members comprise at least one resilient tab formed on each of said first pair of opposing outer side walls and wherein a first position of said retaining surface is defined on an upper surface of said cover at each tab position and a second portion of said retaining surface is defined on a top edge surface of said inner side walls such that said cover is gripped between said top edge surface of said inner side walls and said tabs.

9. An assembly as set forth in claim 7 wherein said resilient members comprise at least on tab formed on each of said opposing inner side walls and said retaining surface comprises a gripping surface formed on said cover for cooperating with said tabs to secure said cover to said housing.

10. An assembly as set forth in claim 7 wherein said cover is comprised of a plate having an upper surface and a lower surface and wherein said heat transfer member comprises an indentation defining an indentation bottom surface that is non-coplanar with said upper and lower surfaces of said plate.

11. An automotive electronic control module assembly comprising:

a plastic housing including a bottom portion, a first pair of opposing outer side walls extending upwardly from said bottom portion, a second pair of opposing outer side walls extending between both of said first pair of opposing outer side walls and cooperating with said bottom portion to define a cavity, and a pair of opposing inner side walls portion within said cavity in an orientation parallel to and spaced apart from said first opposing outer side walls;

a printed circuit board positioned within said cavity between said inner side walls;

a cover positioned over said cavity to enclose said printed circuit board within said housing, said cover having a body portion and including at least one heat transfer member that is positioned closer to said printed circuit board than said body portion to form a heat sink to facilitate hear transfer from said printed circuit board to said cover wherein said cover is comprised of a plate having an upper surface and a lower surface and wherein said hear transfer member comprises an indentation defining an indentation bottom surface that is non-coplanar with said upper and lower surfaces or said plate and wherein said heat transfer member further includes a plurality of longitudinally extending fins laterally spaced apart from each other and extending outwardly from said upper surface of said plate;

a plurality of resilient members formed on said housing; and a retaining surface formed on said cover wherein said resilient members engage said retaining surface to securely attach said cover to said housing.

12. An assembly as set forth in claim 11 wherein at least one of said plurality of longitudinally extending fins is formed on an indentation upper surface.

13. A method for assembling an automotive electronic control module comprising the steps of:

a) mounting a printed circuit board within a cavity formed within a plastic housing; and b) enclosing the printed circuit board within the cavity by snapping a cover plate into gripping engagement with the housing to form a secure snap-fit attachment between the housing and the cover plate wherein step (b) further includes forming the cover plate from aluminum to include a body portion with at least one indentation, and positioning the indentation closer to the printed circuit board than the body portion to form a heat sink that facilitates heat transfer from the printed circuit board to the cover plate forming the housing with a bottom portion, a first pair of opposing outer side walls extending upwardly from the bottom portion, a second pair of opposing outer side walls extending between both of the first pair of opposing outer side walls and cooperating with the bottom portion to define the cavity, and a pair of opposing inner side wails positioned within the cavity in an orientation parallel to and spaced apart from the first pair of opposing outer side walls;

forming resilient tab members on the each of the first pair of opposing outer side walls;

moving the tab members away from an initial position in response to a snap-in insertion force exerted against the cover plate;

abutting a bottom surface of the cover plate against a top edge surface of each of the inner side walls; and returning the tab members to the initial position to grip an upper surface of the cover plate;

and unsnapping the cover plate from the housing when necessary to perform service operations.

* * * * *

UNITED STATES PATENT AND TRADEMARK OFFICE
CERTIFICATE OF CORRECTION

PATENT NO.        : 6,881,077 B2
APPLICATION NO.   : 10/610610
DATED             : April 19, 2005
INVENTOR(S)       : Thorum, Michael It is certified that error appears in the above-identified patent and that said Letters Patent is hereby corrected as shown below:

Item [76] Please correct the last name of the listed inventor on U.S. Patent no. 6,881,077 from Throum to Michael THORUM ( see attached).

Signed and Sealed this

Twenty-ninth Day of August, 2006

JON W. DUDAS
*Director of the United States Patent and Trademark Office*